United States Patent

Voorman et al.

Patent Number: 5,103,117
Date of Patent: Apr. 7, 1992

[54] LATCH CIRCUIT

[75] Inventors: Johannes O. Voorman; Cornelis M. Hart, both of Eindhoven, Netherlands

[73] Assignee: U.S. Philips Corporation, New York, N.Y.

[21] Appl. No.: 713,184

[22] Filed: Jun. 10, 1991

[30] Foreign Application Priority Data

Jun. 22, 1990 [NL] Netherlands .......... 9001442

[51] Int. Cl.$^5$ .......... H03K 19/003
[52] U.S. Cl. .......... 307/279; 307/272.2; 307/454; 307/455; 307/480; 307/355; 307/356
[58] Field of Search ........ 307/454, 455, 480, 355-356, 307/279, 272.2

[56] References Cited

U.S. PATENT DOCUMENTS 4,542,308  9/1985  Winen et al. .......... 307/291
4,835,771  5/1989  Moussie .......... 307/455

FOREIGN PATENT DOCUMENTS 0029057  3/1978  Japan .......... 307/272.2

Primary Examiner—Stanley D. Miller
Assistant Examiner—Margaret Rose Wambach
Attorney, Agent, or Firm—Bernard Franzblau

[57] ABSTRACT

Latch circuit including a differential amplifier T1, T2 for amplifying a data signal D, ND to be latched, applied to the inputs 1, 2 of the differential amplifier, a flip-flop T3, T7, T4, T8 for latching the amplified data signal across the load impedances 6, 7 which are connected to the transistors T1, T2 through switching transistors T5 and T6 if the clock signal CLK is high and are disconnected therefrom if the clock signal is low. When there is a high clock signal the emitter junctions 11, 14 of the flip-flop are currentless. The transistors T5 and T6 fix the voltage at these junctions, and thereby avoid a variation of the junction voltage. Consequently, the decision accuracy of the latching operation is retained even with high clock signal frequencies.

3 Claims, 3 Drawing Sheets

LATCH CIRCUIT

BACKGROUND OF THE INVENTION

1. Field of the Invention

The invention relates to a latch circuit comprising:

a differential amplifier constituted by first and second transistors, each having a first and a second main electrode and a control electrode, the first main electrodes being interconnected to a first junction and the control electrodes being coupled to data signal input terminals for receiving a data signal to be latched, biasing means coupled to the first junction for generating a bias current in the first junction, first and second load impedances inserted between a first supply terminal and first and second output terminals, respectively, for delivering a latched output signal, a flip-flop comprising third and fourth transistors each having a first and a second main electrode and a control electrode, the first main electrodes being interconnected to a second junction, the second main electrode of the third transistor and the control electrode of the fourth transistor being coupled to the first output terminal and the second main electrode of the fourth transistor and the control electrode of the third transistor being coupled to the second output terminal, switching means for coupling, in response to a clock signal, the second main electrodes of the first and second transistors to the first and second output terminals, respectively, the switching means being constituted by fifth and sixth transistors each having a first and a second main electrode and a control electrode, the control electrodes being coupled to a clock signal input for receiving the clock signal, the first main electrodes of the fifth and sixth transistors being coupled to the second main electrodes of the first and second transistors, respectively, and the second main electrodes of the fifth and sixth transistors to the first and second output terminals, respectively.

In the present description and claims the first main electrode, the second main electrode and the control electrode of a transistor correspond to the emitter, collector and base, respectively, when bipolar transistors are used, and to the source, drain and gate, respectively, when unipolar transistors are used.

2. Description of the Related Art

A latch circuit of this type is known from "An 8-bit 100-MHz Full-Nyquist Analog-to-Digital Converter", IEEE Journal Of Solid-State Circuits, Vol. 23, No. 6, December 1988, pp. 1334-1344, FIG. 12. In this prior-art latch circuit the transistors are of the bipolar NPN type. If the clock signal is high, the fifth and sixth transistors of the switching means are rendered conductive and connect the collectors of the first and second transistors of the differential amplifier to the first and second load impedances. An amplified data signal is then present on the first and second output terminals. At that moment the flip-flop is not active because the second junction is maintained currentless by means of two further transistors whose bases are biased by means of the inverse clock signal.

If the clock signal is low, the fifth and sixth transistors are rendered non-conductive so that the connections between the collectors of the first and second transistors of the differential amplifier and the first and second load impedances are interrupted. A further change of the data signal then no longer has an influence on the voltage difference across the first and second output terminals. The latch circuit comprises two further transistors whose collectors are connected to the second junction, the bases to an input terminal for receiving an inverted clock signal and whose emitters, in a first or second emitter junction respectively, are connected to the emitter of the fifth or sixth transistor respectively. Concurrently with the drop of the clock signal, the two further transistors are rendered conductive by the inverted clock signal so that the second junction is connected to the collectors of the first and second transistors of the differential amplifier. The bias current of the biasing means now flows through the first and second transistors to the second junction so that the flip-flop is triggered again and the differential voltage across the first and second output terminals is amplified and latched regeneratively.

A disadvantage of this prior-art latch circuit is that the first or second emitter junction may become currentless for a longer period of time if the sign of the differential voltage on the data signal input terminals is not inverted. During that period of time, the voltage on the emitter junction concerned may flow away. If, subsequently, the sign of the differential voltage is inverted, the relevant transistor of the differential amplifier will become conductive and supply current to the emitter junction. As a result of the presence of parasitic capacitances in the emitter junction, it will take some time before the capacitances are charged and the differential voltage across the first and second output terminals is brought into agreement with the sign inversion of the data signal. With high clock signal frequencies it may happen, in dependence on the magnitude of the data signal, that the sign inversion of the differential voltage across the first and second output terminals has not yet taken place the moment the clock signal becomes low again and the circuit assumes the latching mode. An erroneous decision will then be made.

SUMMARY OF THE INVENTION

It is an object of the invention to provide a latch circuit having improved decision accuracy.

For this purpose, a latch circuit of the type mentioned in the preamble is characterized according to the invention in that the second junction is coupled to the second main electrode of the second transistor and in that the flip-flop further includes seventh and eighth transistors each having a first and a second main electrode and a control electrode, the first main electrodes being coupled to each other and to the second main electrode of the first transistor in a third junction, and the control electrodes and the second main electrodes of the seventh and eighth transistors being connected to corresponding electrodes of the respective third and fourth transistors.

In the latch circuit according to the invention, the flip-flop comprises two additional transistors of which, again assuming they are bipolar NPN transistors, the emitters are connected to the collector of the first transistor of the differential amplifier in a third junction, whereas the second junction is connected to the collector of the second transistor. If the clock signal at the clock signal input and the data signal at the data signal terminal connected to the base of the first transistor are both high, the first and fifth transistors will be conductive and the voltage at the third junction will be fixed at a single diode voltage when a clock signal voltage is applied. With a sufficiently large data signal, the second transistor will block and it will be possible for the voltage at the second junction to flow away a positive direction. Once the second transistor has become conductive again in response to the data signal, the voltage in the second junction will be fixed through the sixth transistor if the clock signal voltage is high and through the third and fourth transistors of the flip-flop and the first and second load impedances if the clock signal voltage is low. The most critical situation is the one in which the data signal on the base of the first transistor presents a variation from strongly positive to just below zero just before the decision moment, that is to say, right before the clock signal becomes low. The latching could then take place right before the zero crossing is detected across the first and second output terminals. If the sixth transistor has not been triggered properly because the second junction has not yet been fully charged, also the start of the latching operation will be slightly delayed for lack of current so that the right decision still will be made.

With respect to the prior-art latch circuit, the latch circuit according to the invention is furthermore advantageous in that the number of stacked transistors is reduced by one, so that it will be possible to work with a smaller supply voltage or with larger signals. In addition, the delay from the data signal input terminals to the output terminals is shorter due to the smaller number of transistors in the signal path between these terminals.

BRIEF DESCRIPTION OF THE DRAWINGS

The invention will now be further explained with reference to the appended drawings in which.

DESCRIPTION OF THE PREFERRED EMBODIMENTS

Figure 1:
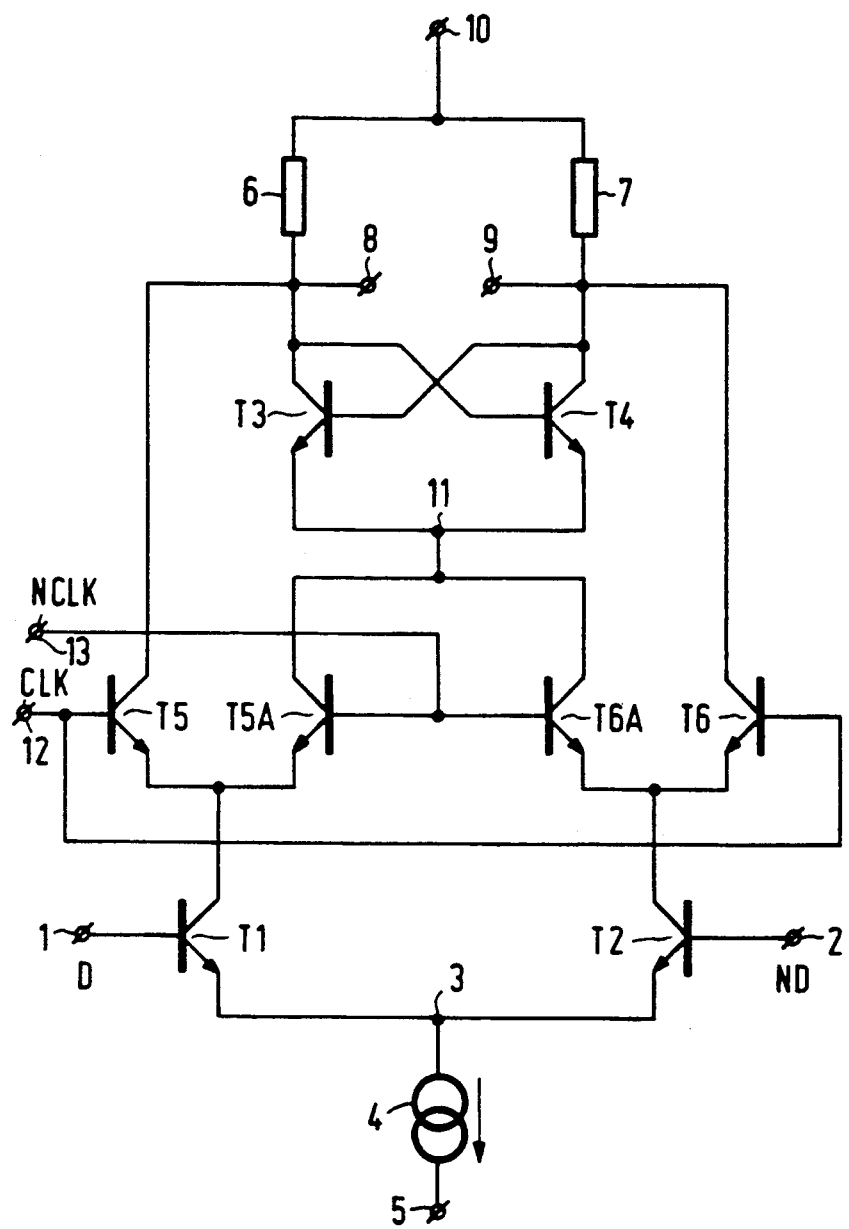
FIG. 1 shows the prior-art latch circuit comprising bipolar NPN transistors.

FIG. 1 shows a prior-art latch circuit. A complementary data signal D, ND to be latched is applied to data signal input terminals 1, 2 which are connected to the bases of the transistors T1, T2, respectively, whose emitters are interconnected to junction 3. The junction 3 is connected to a negative supply terminal 5 through a bias current source 4. The collectors of the transistors T1 and T2 are connected via the emitter-collector paths of the transistors T5 and T6, respectively, to load impedances 6 and 7, respectively, arranged as resistors in this circuit. The junction of the collector of transistor T5 and the load impedance 6 is connected to a first output terminal 8, whereas the junction of the collector of transistor T6 and load impedance 7 is connected to a second output terminal 9. The two remaining connecting points of the load impedances 6 and 7 are connected to a positive supply terminal 10. The output terminals 8 and 9 are further connected to the transistors T3 and T4 arranged as a flip-flop. For this arrangement the base of transistor T4 and the collector of transistor T3 are connected to output terminal 8 and the base of transistor T3 and the collector of transistor T4 are connected to output terminal 9. The emitters of the transistors T3 and T4 are interconnected in a second junction 11 which is connected via the collector-emitter paths of two further transistors T5A and T6A to the collectors of the transistors T1 and T2, respectively. The bases of the transistors T5 and T6 are both connected to a clock signal input 12 to which a clock signal CLK is applied. The bases of the further transistors T5A and T6A are both connected to the clock signal input 13 to which a complementary clock signal NCLK is applied.

If the clock signal CLK is high and the complementary clock signal NCLK low, the transistors T5 and T6 will be conductive and the transistors T5A and T6A will block. The collectors of the transistors T1 and T2 are now connected to the load impedances 6 and 7 so that an amplified data signal is generated across the output terminals 8, 9. Junction 11 of the flip-flop is currentless so that the flip-flop is not active.

If the clock signal CLK is low and the complementary clock signal NCLK high, the transistors T5 and T6 will block and the transistors T5A and T6A will be conductive. In that case the flip-flop is active because the junction 11 is connected to the bias current source 4 through the transistors T5A, T1 and the transistors T6A, T2. The flip-flop now regenerates and latches the voltage difference across the output terminals 8 and 9. Fluctuations in the data signal D, ND do not have any effect on the latching because these fluctuations do not change the sum of the currents through junction 11.

The junction 11 of the flip-flop will be currentless if the clock signal CLK is high. The voltage at this junction 11 may therefore flow away to unspecified higher values so that the next latching operation of the flip-flop in which there is just a sign inversion of the input data signal, may present an inaccuracy. This inaccuracy is caused by the fact that the recharging of the parasitic capacitances which act on the junction 11 is slow, due to which the sign inversion is transferred to the voltages on the load resistances in a delayed manner and may be too late for the next decision moment. Inaccuracy increase with smaller input data signals and higher clock signal frequencies.

Figure 2:
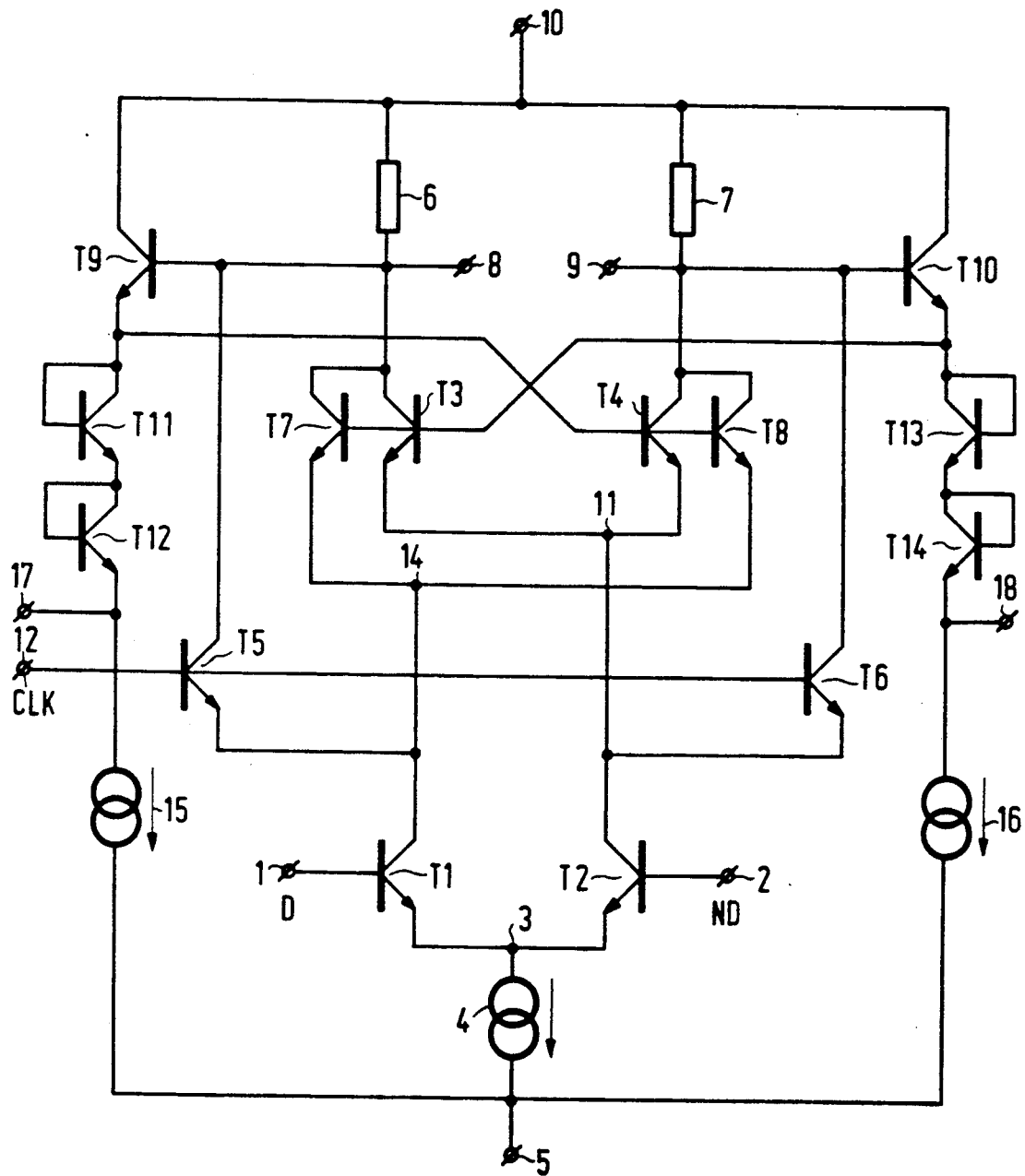
FIG. 2 shows a latch circuit according to the invention comprising bipolar NPN transistors.

In the latch circuit according to the invention, this effect is present in a much smaller measure and, in addition, in critical situations the decision moment is slightly postponed so that the right decision is still made. FIG. 2 shows an embodiment of a latch circuit according to the invention comprising bipolar NPN transistors. In this circuit like components have like reference numerals as shown in FIG. 1. In this circuit the further transistors T5A and T6A are omitted and so is the complementary clock signal input 13. The collector of transistor T2 is now connected directly to the second junction 11 of flip-flops T3, T4 whereas the flip-flop is extended by the transistors T7 and T8 whose bases and collectors are connected to the corresponding electrodes of the respective transistors T3 and T4 and whose emitters are connected to each other and to the collector of transistor T1 in a third junction 14. The bases of the transistors T3, T4 and of the transistors T7, T8 are not connected directly to the output terminals 9, 8 respectively, as was the case in FIG. 1, but through the base-emitter junction of buffer transistors T10 and T9, respectively. The collectors of these transistors T9 and T10 are coupled to the positive supply terminal 10 and their emitters are connected to the negative supply terminal 5 through appropriate load impedances arranged as a series combination of two transistors T11, T12 and T13, T14, respectively, arranged as diodes and through bias current sources 15, 16 respectively. The diode-connected transistors act as level shifters. The junctions between the current sources 15, 16, and the diodes T11, T12 and T13, T14, respectively, are connected to output terminals 17 and 18 from which buffered complementary output signals can be tapped.

If the clock signal CLK is high, the transistors T5 and T6 will be conductive so that the collectors of the transistors T1 and T2 are connected to the load impedances 6 and 7. The data signals D, ND on the terminals 1, 2 appear as amplified versions on the output terminals 8 and 9. The emitters of the transistors T5, T6, respectively, are connected directly to the emitters of the corresponding flip-flops T7, T8 and T3, T4, respectively, so that in the most critical situation in which the input data signal has just had sign inversion when the clock becomes high, a slowness during the recharging of the junctions 14, 11 respectively will cause a delay in applying the correct differential voltage to the load impedances 6 and 7. The flip-flop will also be triggered in a delayed manner so that the right decision is still made. If the clock signal CLK is low, the transistors T5 and T6 will block. The voltage difference across the output terminals 8 and 9 will now be latched by the flip-flop T3, T7, T4, T8. The bias current of current source 4 will be distributed over the transistors T1 and T2 as a result of any data signal variations on the terminals 1 and 2. However, since the flip-flop has a dual arrangement in the transistors T7 and T8, this does not affect the currents through the load impedances 6 and 7, so that the latched operation of the flip-flop is not disturbed by any data signal variations.

Figure 3:
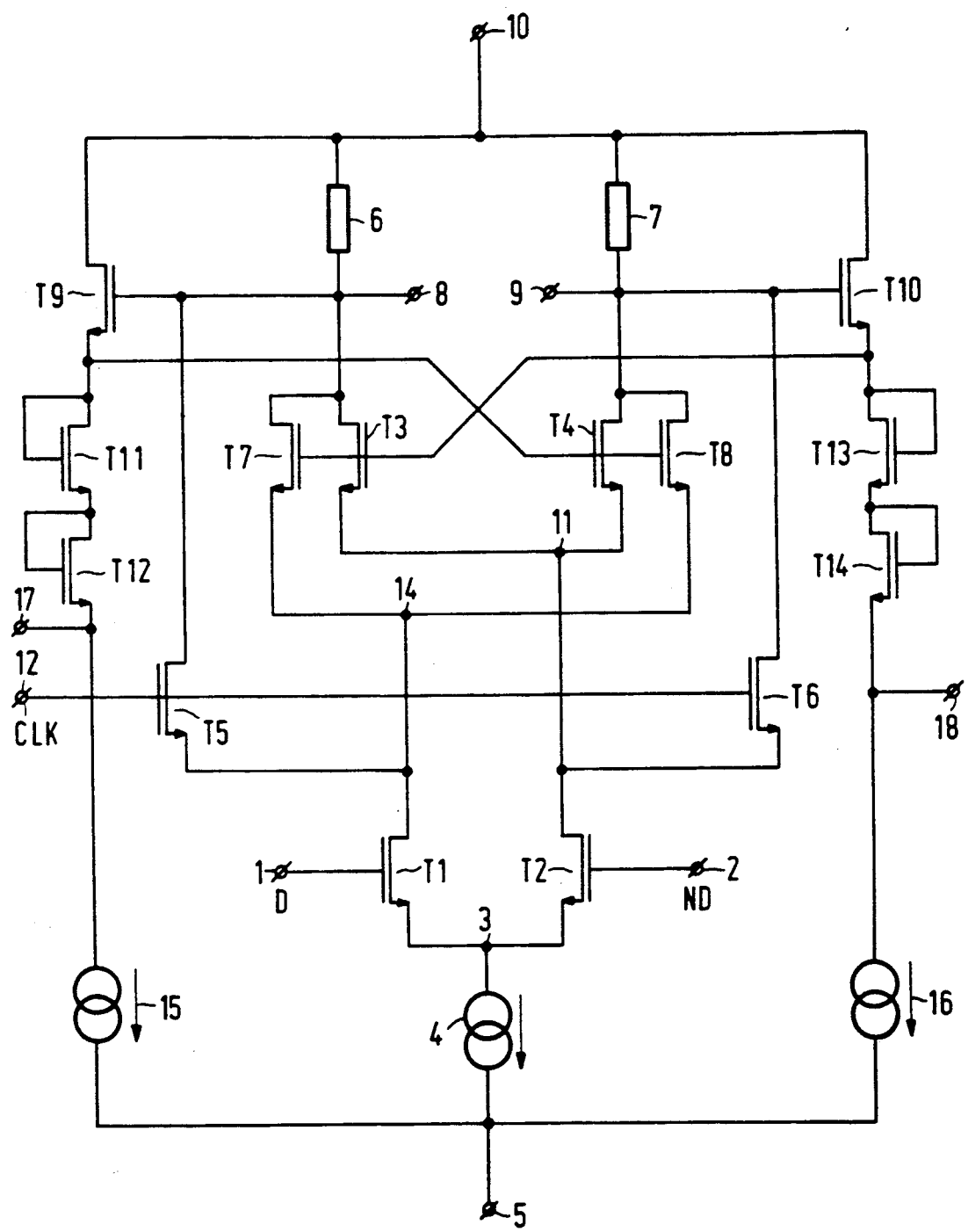
FIG. 3 shows a latch circuit according to the invention comprising unipolar MOS transistors.

FIG. 3 represents a second embodiment of a latch circuit comprising unipolar N-channel MOS transistors. The circuit is furthermore identical with that of FIG. 2 and like components have like reference characters.

The invention is not restricted to the exemplary embodiments shown in FIGS. 2 and 3. In addition to being constituted by resistors, the load impedances 6 and 7 may also be constituted by a series combination of transistors arranged as diodes.

The buffer transistors T9, T10 with associated load impedances T11, T12, 15 and T13, T14, 16, respectively, may also be omitted. In that case the bases of the transistors T3, T7 and of the transistors T4, T8 are to be connected directly to the output terminals 9, 8, respectively.

In lieu of current sources 4, 15 and 16, also resistors also may be selected. Furthermore, the bipolar NPN transistors may be replaced by bipolar PNP transistors and the unipolar N-channel transistors by unipolar P-channel transistors, wherefor the supply voltage on the supply terminals 5 and 10 is then to be reversed.

Alternatively, it is possible for the circuit to partially comprise unipolar transistors, for example, the transistors T1 and T2 and partially comprise bipolar transistors, for example the transistors T3, T4.

We claim:

1. Latch circuit comprising:
   a differential amplifier including first and second transistors, each transistor having a first and a second main electrode and a control electrode, the first main electrodes being interconnected to a first junction and the control electrodes being coupled to data signal input terminals for receiving a data signal to be latched;
   biasing means coupled to the first junction for supplying a bias current to the first junction;
   first and second load impedances coupled between a first supply terminal and first and second output terminals, respectively, for delivering a latched output signal;
   a flip-flop comprising third and fourth transistors each having a first and a second main electrode and a control electrode, the first main electrodes being interconnected to a second junction, the second main electrode of the third transistor and the control electrode of the fourth transistor being coupled to the first output terminal and the second main electrode of the fourth transistor and the control electrode of the third transistor being coupled to the second output terminal; and
   switching means for coupling, in response to a clock signal, the second main electrodes of the first and second transistors to the first and second output terminals, respectively, the switching means comprising fifth and sixth transistors each having a first and a second main electrode and a control electrode, the control electrodes being coupled to a clock signal input for receiving the clock signal, the first main electrodes of the fifth and sixth transistors being coupled to the second main electrodes of the first and second transistors, respectively, and the second main electrodes of the fifth and sixth transistors to the first and second output terminals, respectively; characterized in that the second junction is coupled to the second main electrode of the second transistor, and in that the flip-flop further includes seventh and eighth transistors each having a first and a second main electrode and a control electrode, the first main electrodes being coupled to each other and to the second main electrode of the first transistor in a third junction, and the control electrodes and the second main electrodes of the seventh and eighth transistors being connected to corresponding electrodes of the respective third and fourth transistors.

2. Latch circuit as claimed in claim 1, characterized in that the latch circuit further includes ninth and tenth transistors each having a first and a second main electrode and a control electrode, the control electrodes of said ninth and tenth transistors being coupled to the respective first and second output terminals, the second main electrodes to the first supply terminal and the first main electrodes to the control electrodes of the respective fourth and third transistors and to a second supply terminal through respective third and fourth load impedances.

3. Latch circuit as claimed in claim 2, characterized in that the third and fourth load impedances each comprises a series combination comprising a current source and at least one diode-connected transistor.

* * * * *